US012154698B2

(12) United States Patent
Yacout et al.

(10) Patent No.: US 12,154,698 B2
(45) Date of Patent: Nov. 26, 2024

(54) COATED FUEL PELLETS, METHODS OF MAKING AND USING SAME

(71) Applicant: UCHICAGO ARGONNE, LLC, Chicago, IL (US)

(72) Inventors: Abdellatif M. Yacout, Naperville, IL (US); Sumit Bhattacharya, Darien, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 187 days.

(21) Appl. No.: 16/986,180

(22) Filed: Aug. 5, 2020

(65) Prior Publication Data
US 2022/0044830 A1 Feb. 10, 2022

(51) Int. Cl.
| | | |
|---|---|---|
| *C23C 16/00* | (2006.01) | |
| *C23C 16/34* | (2006.01) | |
| *C23C 16/455* | (2006.01) | |
| *C23C 16/56* | (2006.01) | |
| *C23C 28/00* | (2006.01) | |
| *C23C 28/04* | (2006.01) | |
| *G21C 3/04* | (2006.01) | |
| *G21C 3/20* | (2006.01) | |
| *G21C 3/62* | (2006.01) | |

(52) U.S. Cl.
CPC .............. *G21C 3/626* (2013.01); *C23C 16/34* (2013.01); *C23C 16/45525* (2013.01); *C23C 16/45555* (2013.01); *C23C 16/56* (2013.01); *C23C 28/042* (2013.01); *C23C 28/34* (2013.01); *G21C 3/045* (2019.01); *G21C 3/047* (2019.01); *G21C 3/20* (2013.01); *Y10T 428/2991* (2015.01)

(58) Field of Classification Search
CPC ..................................................... C23C 16/00
See application file for complete search history.

(56) References Cited

U.S. PATENT DOCUMENTS

| | | | |
|---|---|---|---|
| 4,612,159 A * | 9/1986 | Abe | G21C 21/02 376/256 |
| 9,754,687 B2 | 9/2017 | Yacout et al. | |
| 2009/0291538 A1* | 11/2009 | Mise | H01L 21/28167 257/E21.632 |
| 2012/0171403 A1* | 7/2012 | Dodge | C23C 16/045 428/36.1 |
| 2015/0063524 A1* | 3/2015 | Yacout | G21C 21/02 427/6 |
| 2018/0268946 A1 | 9/2018 | Lahoda et al. | |

(Continued)

FOREIGN PATENT DOCUMENTS

CN          107123455 B    *  8/2019

OTHER PUBLICATIONS

CN107123455B—Google Patens (Year: 2019).*

(Continued)

*Primary Examiner* — Kelly M Gambetta
*Assistant Examiner* — Mohammad Mayy
(74) *Attorney, Agent, or Firm* — MARSHALL, GERSTEIN & BORUN LLP

(57) ABSTRACT

Fuel pellets can include a fission material powder, a protective layer coated on the fission material powder, and an oxidation diffusion barrier coated on the protective layer, with the protective layer and oxidation diffusion barrier being formed through ALD to achieve infiltration of the coatings within the fuel pellets.

12 Claims, 5 Drawing Sheets

ALD coating

(56) References Cited

U.S. PATENT DOCUMENTS

2019/0074095 A1  3/2019  Lahoda et al.
2019/0237206 A1* 8/2019  Lahoda ............. C04B 35/62842

OTHER PUBLICATIONS

Becker et al., "Atomic layer deposition of insulating hafnium and zirconium nitrides," Chem. Mater. 16 (2004), 3487-3501.
Bhattacharya et al., "Nanocrystalline ZrN thin film development via atomic layer deposition for U-Mo powder," J. Nuclear Materials, 526, 2019.
Harp et al., "Uranium Silicide Pellet Fabrication by Powder Metallurgy for Accident Tolerant Fuel Evaluation and Irradiation," INL/JOU-15-34239, Nov. 2015.

* cited by examiner scale scale

COATED FUEL PELLETS, METHODS OF MAKING AND USING SAME

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

BACKGROUND

Field of the Disclosure

The disclosure generally relates to coated fuel pellets, methods of preparing coated fuel pellets via atomic layer deposition (ALD), and light-water reactors (LWRs) using coated fuel pellets.

BRIEF DESCRIPTION OF RELATED TECHNOLOGY

Uranium dioxide ($UO_2$) is currently the primary uranium compound used in nuclear fuel worldwide. However, current efforts to enhance the safety and performance of light-water reactors include research into alternative accident-tolerant fuels. For example, several high density uranium fuels have been considered for use in existing light-water reactors. One promising fuel is uranium silicide ($U_3Si_2$) due to its high uranium density (17% higher than $UO_2$), high thermal conductivity, and high melting temperature (1665° C.). However, recent testing has shown that many of these high density uranium fuels, including uranium silicide, are air-sensitive and subject to steam oxidation, requiring modifications, such as coatings.

Traditionally, thin films have been applied to fuel pellets via physical vapor deposition (PVD) and with some limited success via chemical vapor deposition (CVD). PVD has been the more common choice due to its ability to generate contamination free, nanocrystalline and stoichiometric thin films. However, films applied via PVD may delaminate during the fuel plate manufacturing process or during thermal cycles under irradiation. This may be due to weak bonding between the coating and the substrate, or from the dendritic/columnar nature of the coating. Accordingly, improved fuel pellets and methods of preparing these fuel pellets for nuclear reactors, such as light-water reactors are needed.

SUMMARY

In embodiments, a method of preparing a coated fuel pellet via atomic layer deposition (ALD) can include providing a green compact formed from a fission material powder in an atomic layer deposition chamber and pulling a vacuum within the chamber at a rate of about 1 Torr/min to about 10 Torr/min. A protective coating can be deposited on the green compact using atomic layer deposition such that the protective coating infiltrates into the green compact, thereby providing a protective-coated green compact. The protective coating can include a metal nitride, molybdenum, or a combination thereof. An oxide-based coating can be deposited on the protective-coated green compact using atomic layer deposition such that the oxide-based coating infiltrates into the protective-coated green compact, thereby providing an oxidation diffusion barrier. The protective-coated green compact with the oxygen diffusion barrier can be sintered, thereby providing the coated fuel pellet.

In embodiments, a fuel pellet for a light-water reactor (LWR), can include a fission material powder, a protective layer coated on the fission material powder, and an oxidation diffusion barrier coated on the protective layer.

In embodiments, a light-water reactor (LWR) can include a fuel pellet as described herein.

Further aspects and advantages of the disclosure will be apparent to those of ordinary skill in the art from a review of the following detailed description. While the compositions and methods are susceptible of embodiments in various forms, the description is illustrative and is not intended to limit the scope of the disclosure to the specific embodiments described herein.

BRIEF DESCRIPTION OF THE DRAWINGS

FIG. 10 is a focused ion beam (FIB) cross-section of a green compact as described herein.

DETAILED DESCRIPTION

Figures 1A, 1B:
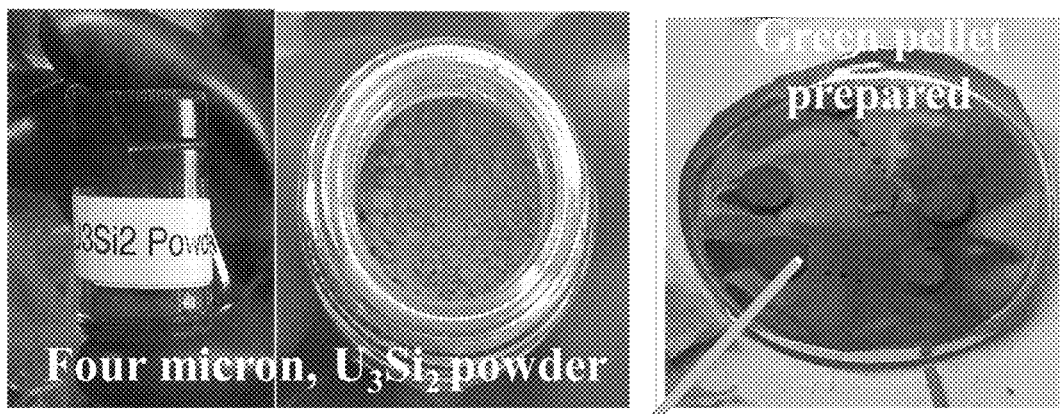
FIG. 1A is an image of a 4 μm uranium silicide ($U_3Si_2$) powder which can be used as the fission material powder used to form the green compacts described herein.
FIG. 1B is an image of green compacts as described herein.
Figure 1C:
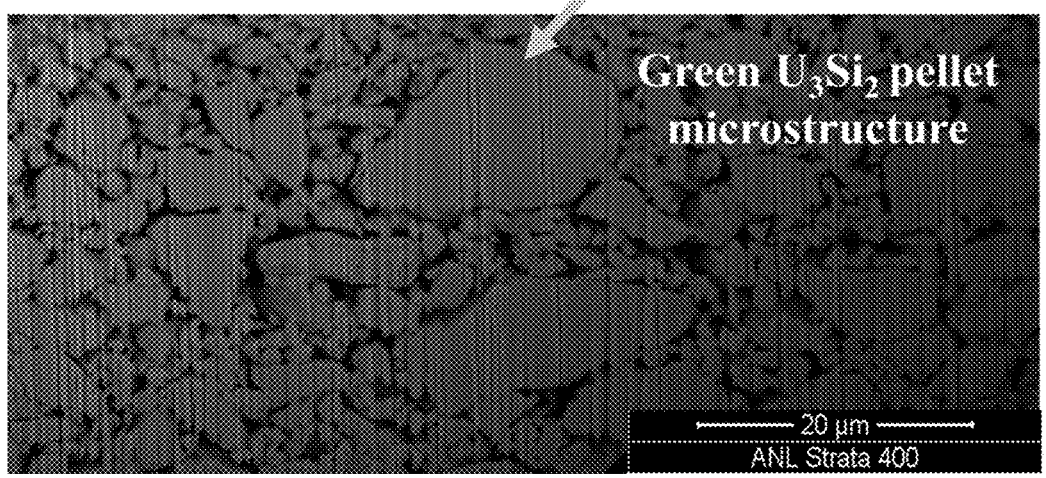

Advantageously, the fuel pellets described and prepared according to the methods of the disclosure have a coating that infiltrates into the green compacts, for example into the pores or channels (e.g., between individual particles of the fission material powder) of the green compacts. Specifically, as used herein, a "green compact" refers to a fission material powder that is pressed, but not yet sintered into a solid fuel pellet. Thus, the coatings described herein are not provided only on a surface of the green compact, but also within the internal spaces of the compact, providing a coating around the individual particles of the green compact. Without intending to be bound by theory, it is believed that while all of the individual particles of the green compact are coated (e.g., according to the methods of the disclosure), the uniformity of the coating between each particle can vary depending on the porosity of the green compact, the dimensions of the channels within the green compact, and the coating application parameters, described in more detail herein. For example, a longer pulse time coupled with a higher precursor pressure and longer purge time can result in improved infiltration in the green compact and uniformity of the coating. However, it is possible for some channels with smaller (e.g., thinner) dimensions to get blocked upon infiltration of the coating, resulting in decrease uniformity of the coating, as the neighboring particles within that channel may be "blocked off" by the applied coating. While all particles of the green compact are enveloped by a coating, it is approximated that about 80-85% of these particles have a uniform coating.

In general, ALD can be used to provide infiltrated coatings, as described herein, as well as surface coatings. Whether the applied coating is merely a surface coating or a coating that infiltrates into the pores of the compact can be controlled by the pulse and purge times of the ALD precursors. For a surface coating only, the pulse and purge times are generally lower than those needed to provide infiltration of the coating. For example, for external coatings only, the ALD precursors only need to form a conformal layer over the exposed surface, which can be achieved with a low pressure and low pulse time. However, for infiltration, higher pressures and pulse times of the precursors are needed to allow the precursors to diffuse into the nano-dimensional channels of the compact. Similarly, for external coatings, the applied precursors are only present within the open space within the ALD reactor, so a lower purge time is sufficient to remove any unused precursors and reaction byproducts after application. In contrast, for infiltrated coatings, the unused precursors and reaction byproducts are not only in the open space of the reactor, but also within the nano-dimensional channels of the compact. Therefore, a longer purge time (e.g., longer negative pressure differential) is needed to remove those materials out of the channels of the compact.

Figure 8:
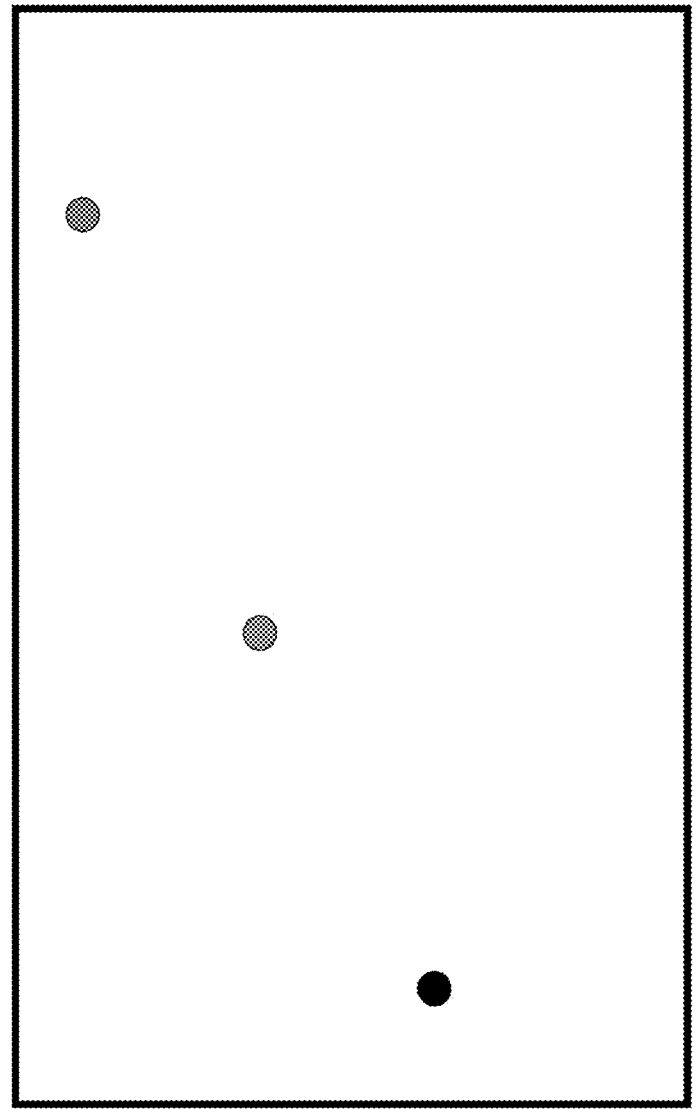
FIG. 8 is a plot of the oxidation onset temperature for an uncoated uranium silicide pellet, a $ZrSiO_4$-surface coated uranium silicide pellet, and a $ZrO_2/SiO_2$-surface coated uranium silicide pellet.

Infiltration of the coatings into the green compact advantageously minimizes or eliminates the issue of cracking due to the thermal incompatibility of the fission material powder of the green compact and the coatings, which is generally an issue for any externally applied coating that only coats the surface of green compacts. For example, as shown in FIG. 8, the presence of coating(s) applied only to the surface of uranium silicide pellet increased the steam oxidation temperature, but only by about 40° C., at which point the coating cracked and the uranium silicide began oxidizing. Because the coatings (i.e., of the disclosure) are applied to individual particles of the green compact, the volume of coating is increased relative to that of a fuel pellet having a coating only on the surface of the green compact. Therefore, even if there is a thermal incompatibility, the level of stress applied over the coatings is relatively small, as that stress can be distributed over a greater volume of coating. This in turn increases the protection of the underlying fission material in the compact by increasing the temperature (e.g., at least about 500° C.) required to oxidize that increased volume of coating and reach the underlying fission material in the green compact. The conditions under which the externally applied coatings are provided in Tables 1 and 2, below. As shown, the pulse and purge times for these coatings are lower than those needed for an infiltrated coating, as described herein (e.g., see Tables A and B).

TABLE 1

Conditions for Surface $ZrSiO_4$ Single Layer
(2 μm thick; 4 consecutive cycles)

| Coating | Temperature of ALD Chamber (° C.) | Cycle | Precursor | Precursor Temp. (° C.) | Pulse Time (s) | Precursor pressure in the reactor (Torr) | Purge Time (s) |
|---|---|---|---|---|---|---|---|
| $ZrO_2$ | 200-225 | 1 | TDMAZr | 75 | 1 | 0.9 | 5-12 |
|  |  | 2 | $H_2O$ | R.T. | 0.5 | 1.5 | 10-15 |
| $SiO_2$ | 175-225 | 3 | TDMASi | 50 | 2 | 0.5 | 5-12 |
|  |  | 4 | $H_2O$ | R.T. | 0.5 | 1.5 | 10-15 |

TABLE 2

Conditions for Surface $ZrO_2/SiO_2$ Multilayer
(2 μm thick; each layer 10 nm thick)

| Coating | Temperature of ALD Chamber (° C.) | Cycle | Precursor | Precursor Temp. (° C.) | Pulse Time (s) | Precursor pressure in the reactor (Torr) | Purge Time (s) |
|---|---|---|---|---|---|---|---|
| $ZrO_2$ | 200-225 | 1 | TDMAZr | 75 | 1 | 0.9 | 5-12 |
|  |  | 2 | $H_2O$ | R.T. | 0.5 | 1.5 | 10-15 |
| $SiO_2$ | 175-225 | 1 | TDMASi | 50 | 2 | 0.5 | 5-12 |
|  |  | 2 | $H_2O$ | R.T. | 0.5 | 1.5 | 10-15 |

Fuel Pellets

In accordance with embodiments, the disclosure provides fuel pellets that can be used in nuclear reactors. For example, the fuel pellets can be use in light-water reactors (LWRs). The fuel pellets include a fission material powder, a protective layer coated on the fission material powder, and an oxidation diffusion barrier coated on the protective layer.

In general, a "fission material powder" is a material that is capable of sustaining a nuclear fission chain reaction. The fission material powder can be used as nuclear fuel in a nuclear reactor. Suitable fission material powders can include, but are not limited to, uranium silicide ($U_3Si_2$), uranium nitride (UN), and uranium carbide (UC), or combinations thereof. In embodiments, the fission material powder includes uranium silicide ($U_3Si_2$). In embodiments, the fission material powder includes uranium nitride (UN). In embodiments, the fission material powder includes uranium carbide (UC). The fission material powder can have an average diameter of about 2 μm to about 8 μm, about 3 μm to about 7 μm, or about 4 μm to about 6 μm. In embodiments, the fission material powder has an average diameter of about 4 μm. For example, in embodiments, the fission material powder is uranium silicide having an average diameter of about 4 μm (FIG. 1A). The fission material powder can be formed into a green compact in accordance with any conventional method known in the art. The green compact can have a diameter of about 5 mm to about 15 mm, about 8 mm to about 12 mm, or about 9 mm to about 11 mm. In embodiments, the green compact has a diameter of about 9 mm. The green compact can have a length of about 0.25 cm to about 2 cm, about 0.5 cm to about 1.5 cm, or about 1 cm to about 1.25 cm. In embodiments, the green compact has a length of about 1 cm.

The fuel pellets include a protective coating coated on the fission material powder. The protective coating can include a metal nitride, molybdenum (Mo), or a combination thereof. In embodiments, the protective coating includes a metal nitride. In embodiments, the protective coating includes molybdenum. In embodiments, the protective coating includes each of a metal nitride and molybdenum. Suitable metal nitrides that can be used in the protective coating include, but are not limited to aluminum nitride (AlN), silicon nitride ($Si_3N_4$), titanium nitride (TiN), and zirconium nitride (ZrN). In embodiments, the protective coating includes one or more of aluminum nitride (AlN), silicon nitride ($Si_3N_4$), titanium nitride (TiN), zirconium nitride (ZrN), and molybdenum (Mo). In embodiments, the protective coating is aluminum nitride (AlN). In embodiments, the protective coating is silicon nitride ($Si_3N_4$). In embodiments, the protective coating is titanium nitride (TiN). In embodiments, the protective coating is zirconium nitride (ZrN). In embodiments, the protective coating is molybdenum (Mo). The protective coating can be free of compounds, which cannot be applied via atomic layer deposition, such as magnesium nitride.

The protective coating on the fission material powder must be thick enough to prevent oxidation of the fission material powder. Pore sizes of the fission material powder, or a green compact prepared therefrom, can range from approximately 1 nm to about 1000 nm (1 μm). The protective coating should not fill up all of the pores or channels, as there must be space for the oxidation diffusion barrier to also infiltrate into the fission material powder or green compact. In embodiments, the protective coating (e.g., on each individual particle of the green compact) has a thickness of about 20 nm to about 50 nm, for example at least about 20, 25, 30, 25, or 40 nm and/or up to about 50, 45, 40, 35, or 30 nm, such as about 25 nm to about 50 nm, about 30 nm to about 45 nm, or about 30 nm to about 40 nm.

The fuel pellets include an oxidation diffusion barrier coated on the protective layer. Oxidation diffusion barriers can include those prepared from one or more of aluminum oxide, zirconium oxide, zirconium (IV) silicate, silicon dioxide, yttrium oxide, and chromium oxides ($Cr_xO_y$). In embodiments, the oxidation diffusion barrier includes aluminum oxide ($Al_2O_3$), zirconium oxide ($ZrO_2$), zirconium (IV) silicate ($ZrSiO_4$), silicon dioxide ($SiO_2$), yttrium oxide ($Y_2O_3$), chromium (II) oxide (CrO), chromium (III) oxide ($Cr_2O_3$), chromium (IV) oxide ($CrO_2$), chromium (VI) oxide ($CrO_3$), and combinations thereof. In embodiments, the oxidation diffusion barrier includes aluminum oxide ($Al_2O_3$). In embodiments, the oxidation diffusion barrier includes zirconium oxide ($ZrO_2$). In embodiments, the oxidation diffusion barrier includes zirconium (IV) silicate ($ZrSiO_4$). In embodiments, the oxidation diffusion barrier includes silicon dioxide ($SiO_2$). In embodiments, the oxidation diffusion barrier includes yttrium oxide ($Y_2O_3$). In embodiments, the oxidation diffusion barrier includes chromium (II) oxide (CrO). In embodiments, the oxidation diffusion barrier includes chromium (III) oxide ($Cr_2O_3$). In embodiments, the oxidation diffusion barrier includes chromium (IV) oxide ($CrO_2$). In embodiments, the oxidation diffusion barrier includes chromium (VI) oxide ($CrO_3$).

The oxidation diffusion layer can have a thickness such that the protective layer and the oxidation diffusion barrier have a total thickness of at least about 200 nm. For example, in embodiments, the protective layer and the oxidation diffusion barrier have a total thickness of at least about 200, 300, 400, 500 or 600 nm and/or up to about 1000, 900, 800, 700, 600, or 500 nm, such as about 200 nm to about 1000 nm, about 300 nm to about 1000 nm, about 400 nm to about 1000 nm or about 500 to about 1000 nm. In embodiments, the protective layer and the oxidation diffusion barrier have a total thickness about 500 nm to about 1000 nm.

The protective layer and the oxidation diffusion barrier can be present in a total amount of about 2 wt % to about 10 wt %, based on the total weight of the fuel pellet, for example at least about 2, 2.5, 3, 3.5, 4, 4.5, 5, 5.5, or 6 wt % and/or up to 10, 9.5, 9, 8.5, 8, 7.5, 7, 6.5, 6, 5.5, or 5 wt %, such as about 2 wt % to about 9 wt %, about 4 wt % to about 10 wt %, about 5 wt % to about 7 wt %, about 6 wt % to about 8 wt %, or about 6 wt % to about 7 wt %, based on the total weight of the fuel pellet. In embodiments, the protective layer and the oxidation diffusion barrier are present in a total amount of about 5 wt % to about 8 wt %, based on the total weight of fuel pellet.

Advantageously, the fuel pellets of the disclosure can have an onset temperature for steam oxidation of at least about 500° C., 550° C., 600° C., 650° C., or 700° C. The fuel pellets can have increased onset temperatures due, in part, to the protective coating and oxidation diffusion barrier, which can be applied using atomic layer deposition (ALD) as described herein.

Methods of Preparing Coated Fuel Pellets

The methods of the disclosure include preparing a coated fuel pellet via atomic layer deposition (ALD). Formation of the green compact can be carried out using any known methods. For example, the green compact can be formed using a pressing die in an inert atmosphere (e.g., a glove box), thereby preventing any oxidation of the fission material powder. Suitable fission material powders include those described herein for the fuel pellet, such as uranium silicide ($U_3Si_2$), uranium nitride (UN), and uranium carbide (UC). In embodiments, the fission material powder includes uranium silicide ($U_3Si_2$), uranium nitride (UN), uranium carbide (UC), or a combination thereof. In embodiments, the fission material powder is uranium silicide ($U_3Si_2$). In embodiments, the fission material powder is uranium nitride (UN). In embodiments, the fission material powder is uranium carbide (UC).

After being pressed, the green compacts can be transferred to an atomic layer deposition chamber, which can similarly be situated within an inert atmosphere (e.g., a glove box). The deposition chamber can be pre-heated (e.g., before and/or after transferring the green compact thereto), for example up to about 150° C. for a couple of hours in order to allowed any moisture to be removed from the ALD chamber and/or the green compact. Once the green compact is situated in the atomic layer deposition chamber, a vacuum can be pulled within the chamber at a rate of about 1 Torr/min to about 10 Torr/min, for example at least about 1, 2, 3, 4, 5, or 6 Torr/min, and/or up to 10, 9, 8, 7, 6, 5, or 4 Torr/min. For example, the vacuum can be pulled at a rate of about 2 Torr/min to about 9 Torr/min, about 3 Torr/min to about 8 Torr/min, about 4 Torr/min to about 7 Torr/min, about 5 Torr/min to about 6 Torr/min, or about 4 Torr/min to about 10 Torr/min. In embodiments, the vacuum is pulled at a rate of about 5 Torr/min. The vacuum can be pulled until the atomic layer deposition chamber has a suitable pressure, for example, a pressure of about 0.1 Torr to about 1.0 Torr, about 0.3 Torr to about 0.8 Torr, about 0.4 Torr to about 0.7 Torr, or about 0.5 Torr to about 0.6 Torr. In embodiments, the vacuum is pulled until the atomic layer deposition chamber has a pressure of about 0.6 Torr. Slowly decreasing the pressure from about 760 Torr (1 atm) to about 0.6 Torr advantageously prevents the collapse of the green compact and allows the gas trapped within the pores or channels of the green compact to be gently released without compromising the structure of the green compact due to pressure differences.

Once a suitable pressure in the atomic layer deposition chamber is achieved, a protective coating is deposited on the green compact, such that the protective coating infiltrates into the green compact. The protective coating is applied using ALD. Suitable protective coatings include those described herein for the fuel pellet. For example, the protective coating can include a metal nitride, molybdenum (Mo), or a combination thereof. In embodiments, the protective coating includes a metal nitride. In embodiments, the protective coating includes molybdenum. In embodiments, the protective coating includes each of a metal nitride and molybdenum. Suitable metal nitrides that can be used in the protective coating include, but are not limited to aluminum nitride (AlN), silicon nitride ($Si_3N_4$), titanium nitride (TiN), and zirconium nitride (ZrN). In embodiments, the metal nitride is aluminum nitride (AlN), silicon nitride ($Si_3N_4$), titanium nitride (TiN), zirconium nitride (ZrN), or a combination thereof. In embodiments, the metal nitride is aluminum nitride (AlN). In embodiments, the metal nitride is silicon nitride ($Si_3N_4$). In embodiments, the metal nitride is titanium nitride (TiN). In embodiments, the metal nitride is zirconium nitride (ZrN).

As would be appreciated by those skilled in the art, ALD typically involves exposing a surface of a substrate (e.g., the green compact) to various precursors in alternating and non-overlapping pulses. In embodiments, depositing the protective coating includes alternately depositing two or more protective coating precursors on the green compact. For example, depositing the protective coating can include alternately depositing two, three, four, five, or more protective coating precursors on the green compact. Suitable examples of protective coating precursors include, but are not limited to, tetrakis(dimethylamido)zirconium(IV) (TDMAZ), trimethylaluminum, tris(dimethylamido)aluminum (III) (TDMAAI), tetrakis(diethylamido)titanium(IV) (TDEAT), tris(dimethylamino)silane (TDMASi), disilane, molybdenum hexafluoride, ammonia, and hydrazine. In embodiments, each of the two or more protective coating precursors include TDMAZ, trimethylaluminum, tris(dimethylamido)aluminum(III), TDEAT, TDMASi, disilane, molybdenum hexafluoride, ammonia, hydrazine, or any combination thereof.

In embodiments, the protective coating precursors are TDMAZ and ammonia. In embodiments where the protective coating precursors are TDMAZ and ammonia, the protective coating includes zirconium nitride. In embodiments, the protective coating precursors are trimethylaluminum and ammonia. In embodiments, the protective coating precursors are trimethylaluminum and hydrazine. In embodiments where the protective coating precursors are trimethylaluminum and ammonia and/or hydrazine, the protective coating includes aluminum nitride. In embodiments, the protective coating precursors are tris(dimethylamido)aluminum(III) (TDMAAI) and ammonia. In embodiments, the protective coating precursors are tris(dimethylamido)aluminum(III) and hydrazine. In embodiments where the protective coating precursors are tris(dimethylamido)aluminum(III) and ammonia and/or hydrazine, the protective coating includes aluminum nitride. In embodiments, the protective coating precursors are TDEAT and ammonia. In embodiments, the protective coating precursors are TDEAT and hydrazine. In embodiments where the protective coating precursors are TDEAT and ammonia and/or hydrazine, the protective coating includes titanium nitride. In embodiments, the protective coating precursors are tris(dimethylamino)silane (TDMSi) and ammonia. In embodiments, the protective coating precursors are tris(dimethylamino)silane (TDMSi) and hydrazine. In embodiments where the protective coating precursors are tris(dimethylamino)silane and ammonia and/or hydrazine, the protective coating includes titanium nitride. In embodiments, the protective coating precursors are molybdenum hexafluoride and disilane. In embodiments wherein the protective coating precursors are molybdenum hexafluoride and disilane, the protective coating includes molybdenum.

A pulse time of about 1 second to about 10 seconds can be used in depositing each of the protective coating precursors. In embodiments, each of the protective coating precursors has a pulse time of at least about 1, 2, 3, 4, 5, or 6 seconds and/or up to about 10, 9, 8, 7, 6, 5, or 4 seconds, such as about 1 second to about 10 seconds, about 3 seconds to about 7 seconds, about 2 seconds to about 5 seconds, or about 4 seconds to about 6 seconds. The pulse time for each of the two or more protective coating precursors can be the same or different. For example, in embodiments, each of the two or more protective coating precursors has the same pulse time. In embodiments, each of the two or more protective coating precursors has a different pulse time. For example, for a ZrN protective coating, a TDMAZ precursor can have a pulse time of about 5 seconds, while an ammonia precursor can have a pulse time of about 2 seconds.

A purge time of at least about 60 seconds can be used in between the application of each of the protective coating precursors. In embodiments, the purge time (e.g., between application of each of the two or more protective coating precursors) can be at least about 60, 65, 70, 75, 80, 85, 90, 95, or 100 seconds and/or up to about 120, 115, 110, 105, 100, 95, 90, 85 or 80 seconds, such as about 60 seconds to about 120 seconds, about 75 seconds to about 100 seconds, or about 85 seconds to about 95 seconds. In embodiments, the purge time is about 60 seconds to about 120 seconds. In embodiments, the purge time is at least about 75 seconds. The purge time between the application of each of the two or more protective coating precursors can be the same or different. For example, in embodiments, the purge time between the application of each of the two or more protective coating precursors is the same. In embodiments, the purge time between the application of each of the two or more protective coating precursors is different. The purge time should be sufficiently long in order to avoid the precursors from reacting with the subsequently applied precursor. For example, when the protective coating precursors are applied with a purge time of less than 60 seconds, the first precursor applied to the green compact may react with the second precursor applied to the green compact within the pores or channels of the green compact, leading to blockage of the pores or channels, non-uniform growth patterns, and inconsistent coating.

The protective coating can be deposited at a temperature (e.g., in the ALD chamber) of about 200° C. to about 250° C., for example at least about 200, 205, 210, 215, 220, 225, 230, or 235° C. and/or up to about 250, 245, 240, 235, 230, 225, 220 or 215° C., such as about 210° C. to about 240° C., about 215° C. to about 235° C., or about 220° C. to about 230° C. In embodiments, the protective coating is deposited at a temperature of about 220° C. to about 235° C., such as about 230° C. In order to ensure adequate and uniform heating, the temperature of the atomic layer deposition chamber can be increased to the protective coating deposition temperature and held for about 1 hour, about 2 hours, or about 3 hours prior to applying the first protective coating precursor. Allowing this time for the temperature to equilibrate allows the fission material powder of the green compact to degas (e.g., volatile organic material) and develop a clean surface for the ALD coatings.

Each of the protective coating precursors can have a temperature ranging from about 20° C. to about 100° C. immediately prior to applying to the green compact in the ALD chamber. For example, the protective coating precursor(s) can optionally be pre-heated in order to increase the pulse pressure of the precursor. In embodiments, the protective coating precursor is not pre-heated (e.g., has a temperature of about 20° C. to about 30° C. (e.g., room temperature) immediately prior to applying). In embodiments, the protective coating precursor is pre-heated to a temperature of about 35, 45, 50, 55, 60, 70, 75, 80, 90, or 100° C. immediately prior to applying.

Each of the protective coating precursors can be applied a pressure of about 2 Torr to about 5 Torr, for example at a pressure of at least about 2, 2.5, 3, 3.5 or 4 Torr, and/or up to about 5, 4.5, 4, 3.5, 3, or 2.5 Torr. In embodiments, the protective coating precursor is applied at a pressure of about 2 Torr to about 2.5 Torr. In embodiments, the protective coating precursor is applied at a pressure of about 2 Torr to about 3 Torr. In embodiments, the protective coating precursor is applied at a pressure of about 3 Torr. In embodiments, the protective coating precursor is applied at a pressure of about 5 Torr.

Table A, below, provides exemplary protective coating precursors, temperatures (of the ALD chamber and individual precursors), pulse times, purge times, and pressures that can be used to apply various protective coatings to the green compact. It should be understood that these conditions are not limiting and are provided merely as suitable examples.

TABLE A

Exemplary Protective Coating Application Conditions

| Protective Coating | Temperature of ALD Chamber (° C.) | Precursor | Precursor Temp. (° C.) | Pulse Time (s) | Precursor pressure in the reactor (Torr) | Purge Time (s) |
|---|---|---|---|---|---|---|
| ZrN | 200-225 | TDMAZr | 75 | 8 | 2-2.5 | 75-85 |
|  |  | $NH_3$ | R.T. | 2 | 5 | 60-70 |
| AlN | 230-260 | TDMAAl | 75 | 8 | 2-3 | 75-85 |
|  |  | $NH_3$ | R.T. | 2 | 5 | 60-70 |
| $Si_3N_4$ | 200-240 | TDMASi | 50 | 8 | 2.5-3 | 75-85 |
|  |  | $NH_3$ | R.T. | 2 | 5 | 60-70 |
| Mo | 150-175 | $MoF_6$ | R.T. | 5 | 3 | 100-120 |
|  |  | $Si_2H_6$ | R.T. | 5 | 5 | 100-120 |

Depositing the protective coating on the green compact, as described herein, such that the protective coating infiltrates into the green compact, provides a protective-coated green compact. Significantly, the protective coating can minimize the air sensitivity and susceptibility of the green compact to oxidation. Accordingly, after the protective coating is applied to the green compact, it is possible to deposit any subsequent coatings or surface modifications (e.g., the oxide-based coating) outside of an inert atmosphere.

After forming the protective-coated green compact, an oxide-based coating can be deposited on the protective-coated green compact such that the oxide-based coating infiltrates into the protective-coated green compact. The oxide-based coating is applied via ALD. Deposition of the oxide-based coating provides an oxidation diffusion barrier on the protective-coated green compact. Suitable examples of oxide-based coatings include those described herein for the oxidation diffusion barrier of the fuel pellet, such as aluminum oxide, zirconium oxide, zirconium (IV) silicate, silicon dioxide, yttrium oxide, and chromium oxides ($Cr_xO_y$). In embodiments, the oxide-based coating includes aluminum oxide ($Al_2O_3$), zirconium oxide ($ZrO_2$), zirconium (IV) silicate ($ZrSiO_4$), silicon dioxide ($SiO_2$), yttrium oxide ($Y_2O_3$), chromium (II) oxide (CrO), chromium (III) oxide ($Cr_2O_3$), chromium (IV) oxide ($CrO_2$), chromium (VI) oxide ($CrO_3$), or a combination thereof. In embodiments, the oxide-based coating is aluminum oxide ($Al_2O_3$). In embodiments, the oxide-based coating is zirconium oxide ($ZrO_2$). In embodiments, the oxide-based coating is zirconium (IV) silicate ($ZrSiO_4$). In embodiments, the oxide-based coating is silicon dioxide ($SiO_2$). In embodiments, the oxide-based coating is yttrium oxide ($Y_2O_3$). In embodiments, the oxide-based coating is chromium (II) oxide (CrO). In embodiments, the oxide-based coating is chromium (III) oxide ($Cr_2O_3$). In embodiments, the oxide-based coating is chromium (IV) oxide ($CrO_2$). In embodiments, the oxide-based coating is chromium (VI) oxide ($CrO_3$).

Each of the oxide-based coatings described herein are well known for their oxidation diffusion barrier capabilities. However, these coatings cannot be directly applied to the surface of the green compact (e.g., without the protective coating) via ALD, as the deposition of an oxide-based coating requires a precursor, such as water, that can initiate oxidation of the green compact. Advantageously, the application of each of the protective coating and the oxide-based coating provide distinct advantages. While the oxide-based coating provides oxidation diffusion barrier capabilities to the green compact, the protective coating has a very low thermal neutron capture cross section, which is advantageous, particularly in nuclear applications. Moreover, as described herein, the protective coating stabilizes the green compact to air, such that the green compact can be handled outside an inert atmosphere.

Similar to the protective coating, depositing the oxide-based coating can include alternately depositing two or more oxide-based coating precursors on the protective-coated green compact. For example, depositing the oxide-based coating can include alternately depositing two, three, four, five, or more oxide-based coating precursors on the protective-coated green compact. Suitable examples of oxide-based coating precursors include, but are not limited to, tetrakis(dimethylamido)zirconium(IV) (TDMAZ), bis(methyl-$\eta^5$-cyclopentadienyl)methoxymethylzirconium (ZRCMMM), trimethylaluminum, tris(dimethylamido)aluminum(III), tetrakis(diethylamido)titanium(IV) (TDEAT), tetrakis(dimethylamido)titanium(IV) (TDMAT), titanium tetrachloride, tris(dimethylamino)silane (TDMAS), hexachlorodisilane, water, hydrogen peroxide, ozone, methanol, chromyl chloride, tris(cyclopentadienyl)yttrium ($Cp_3Y$), tris(methylcyclopentadienyl)yttrium (($CpCH_3)_3Y$), bis(cyclopentadienyl)chromium(II), and bis(pentamethylcyclopentadienyl)chromium(II). In embodiments, each of the two or more oxide-based coating precursors include TDMAZ, ZRCMMM, trimethylaluminum, tris(dimethylamido)aluminum(III), TDEAT, TDMAT, titanium tetrachloride, TDMAS, hexachlorodisilane, water, hydrogen peroxide, ozone, methanol, Cp₃Y, (CpCH₃)₃Y, bis(cyclopentadienyl)chromium(II), chromyl chloride, bis(pentamethylcyclopentadienyl)chromium(II), or a combination thereof. In embodiments, the oxide-based coating precursors are TDMAZ, TDMAS, and water. In embodiments, the oxide-based coating precursors are TDMAZ, TDMAS, and hydrogen peroxide. In embodiments where the oxide-based coating precursors are TDMAZ, TDMAS, and water and/or hydrogen peroxide, the oxide-based coating is $ZrSiO_4$. In embodiments, the oxide-based coating precursors are TDMAZ and water. In embodiments, the oxide-based coating precursors are TDMAZ and hydrogen peroxide. In embodiments where the oxide-based coating precursors are TDMAZ and water and/or hydrogen peroxide, the oxide-based coating is $ZrO_2$. In embodiments, the oxide-based coating precursors are trimethylaluminum and water. In embodiments, the oxide-based coating precursors are trimethylaluminum and hydrogen peroxide. In embodiments where the oxide-based coating precursors are trimethylaluminum and water and/or hydrogen peroxide, the oxide-based coating is $Al_2O_3$. In embodiments, the oxide-based coating precursors are TDMAS and water. In embodiments, the oxide-based coating precursors are TDMAS and hydrogen peroxide. In embodiments where the oxide-based coating precursors are TDMAS and water and/or hydrogen peroxide, the oxide-based coating is $SiO_2$. In embodiments, the oxide-based coating precursors are $(CpCH_3)_3Y$ and water. In embodiments, the oxide-based coating precursors are $(CpCH_3)_3Y$ and hydrogen peroxide. In embodiments where the oxide-based coating precursors are $(CpCH_3)_3Y$ and water and/or hydrogen peroxide, the oxide-based coating is $Y_2O_3$. In embodiments, the oxide-based coating precursors are chromyl chloride and methanol. In embodiments where the oxide-based coating precursors are chromyl chloride and methanol, the oxide-based coating is $Cr_2O_3$. In embodiments, the oxide-based coating precursors are TDMAT and water. In embodiments, the oxide-based coating precursors are TDMAT and hydrogen peroxide. In embodiments where the oxide-based coating precursors are TDMAT and water and/or hydrogen peroxide, the oxide-based coating is $TiO_2$.

A pulse time of about 1 second to about 10 seconds can be used in depositing each of the oxide-based coating precursors. In embodiments, each of the oxide-based coating precursors has a pulse time of at least about 1, 2, 3, 4, 5, or 6 seconds and/or up to about 10, 9, 8, 7, 6, 5, or 4 seconds, such as about 1 second to about 10 seconds, about 3 seconds to about 7 seconds, or about 4 seconds to about 6 seconds. The pulse time for each of the two or more oxide-based coating precursors can be the same or different. For example, in embodiments, each of the two or more oxide-based coating precursors has the same pulse time. In embodiments, each of the two or more oxide-based coating precursors has a different pulse time.

A purge time of at least about 60 second can be used in between deposition of each of the oxide-based coating precursors. In embodiments, the purge time (e.g., between application of each of the two or more oxide-based coating precursors) can be at least about 60, 65, 70, 75, 80, 85, 90, 95, or 100 seconds and/or up to about 120, 115, 110, 105, 100, 95, 90, 85 or 80 seconds, such as about 60 seconds to about 120 seconds, about 75 seconds to about 100 seconds, or about 85 seconds to about 95 seconds. In embodiments, the purge time is about 60 seconds to about 120 seconds. In embodiments, the purge time is at least about 75 seconds. The purge time between the application of each of the two or more oxide-based coating precursors can be the same or different. For example, in embodiments, the purge time between the application of each of the two or more oxide-based coating precursors is the same. In embodiments, the purge time between the application of each of the two or more oxide-based coating precursors is different. As with the protective coating, the purge time of the oxide-based coating precursors should be sufficiently long in order to avoid the precursors from reacting with the subsequently applied precursor. For example, when the oxide-based coating precursors are applied with a purge time of less than 60 seconds, the first precursor applied to the protective-coated green compact may react with the second precursor applied to the protective-coated green compact within the pores or channels of the protective-coated green compact, leading to blockage of the pores or channels, non-uniform growth patterns, and inconsistent coating.

The oxide-based coating (e.g., each of the two or more oxide-based coating precursors) can be deposited at a temperature of about 200° C. to about 250° C., for example at least about 200, 205, 210, 215, 220, 225, 230, or 235° C. and/or up to about 250, 245, 240, 235, 230, 225, 220 or 215° C., such as about 210° C. to about 240° C., about 215° C. to about 235° C., or about 220° C. to about 230° C. In embodiments, the oxide-based coating is deposited at a temperature of about 220° C. to about 235° C.

Each of the oxide-based coating precursors can have a temperature ranging from about 20° C. to about 100° C. immediately prior to applying to the protective-coated green compact in the ALD chamber. For example, the oxide-based coating precursor(s) can optionally be pre-heated in order to increase the pulse pressure of the precursor. In embodiments, the oxide-based coating precursor is not pre-heated (e.g., has a temperature of about 20° C. to about 30° C. (e.g., room temperature) immediately prior to applying). In embodiments, the oxide-based coating precursor is pre-heated to a temperature of about 35, 45, 50, 55, 60, 70, 75, 80, 90, or 100° C. immediately prior to applying.

Each of the oxide-based coating precursors can be applied a pressure of about 2 Torr to about 7 Torr, for example at a pressure of at least about 2, 2.5, 3, 3.5, 4, 4.5, or 5 Torr, and/or up to about 7, 6.5, 6, 5.5, 5, 4.5, or 4 Torr. In embodiments, the oxide-based coating precursor is applied at a pressure of about 2 Torr to about 2.5 Torr. In embodiments, the oxide-based coating precursor is applied at a pressure of about 2.5 Torr to about 3 Torr. In embodiments, the oxide-based coating precursor is applied at a pressure of about 3 Torr to about 4 Torr. In embodiments, the oxide-based coating precursor is applied at a pressure of about 5 Torr to about 7 Torr. In embodiments, the oxide-based coating precursor is applied at a pressure of about 2.5 Torr. In embodiments, the oxide-based coating precursor is applied at a pressure of about 5 Torr. In embodiments, the oxide-based coating precursor is applied at a pressure of about 7 Torr.

Table B, below, provides exemplary oxide-based coating precursors, temperatures (of the ALD chamber and individual precursors), pulse times, purge times, and pressures that can be used to apply various protective coatings to the protective-coated green compact. It should be understood that these conditions are not limiting and are provided merely as suitable examples.

TABLE B

Exemplary Oxide-Based Coating Application Conditions

| Oxide-Based Coating | Temperature of ALD Chamber (° C.) | Precursor | Precursor Temp. (° C.) | Pulse Time (s) | Precursor pressure in the reactor (Torr) | Purge Time (s) |
|---|---|---|---|---|---|---|
| ZrO$_2$ | 200-225 | TDMAZ | 75 | 8 | 2-2.5 | 75-85 |
| | | H$_2$O | R.T. | 3 | 5 | 60-70 |
| Al$_2$O$_3$ | 175-220 | TMA | 40 | 5 | 7 | 75-85 |
| | | H$_2$O | R.T. | 3 | 5 | 60-70 |
| SiO$_2$ | 175-225 | TDMAS | 50 | 8 | 2.5-3 | 75-85 |
| | | H$_2$O$_2$ | R.T. | 3 | 7 | 60-70 |
| Y$_2$O$_3$ | 220-300 | (CpCH$_3$)$_3$Y | 75 | 5 | 2.5 | 75-85 |
| | | H$_2$O | R.T. | 3 | 5 | 60-70 |
| ZrSiO$_4$ | 200-230 | TDMAZ | 75 | 8 | 2-2.5 | 75-85 |
| | | H$_2$O | R.T. | 3 | 5 | 60-70 |
| | | TDMAS | 50 | 8 | 2.5-3 | 75-85 |
| | | H$_2$O$_2$ | R.T. | 3 | 7 | 60-70 |
| Cr$_2$O$_3$ | 250-350 | CrO$_2$Cl$_2$ | 100 | 5 | 3-4 | 45-55 |
| | | CH$_3$OH | R.T. | 5 | 5-7 | 50-60 |
| TiO$_2$ | 200-230 | TDMAT | 75 | 8 | 2-2.5 | 75-85 |
| | | H$_2$O | R.T. | 3 | 5 | 60-70 |

Depositing the oxide-based coating on the protective-coated green compact, as described herein, such that the oxide-based coating infiltrates into the protective-coated green compact, provides a protective-coated green compact with an oxygen diffusion barrier.

The methods of the disclosure further include sintering the protective-coated green compact with the oxygen diffusion barrier, thereby providing a coated fuel pellet. As would be appreciated by those skilled in the art, sintering refers to the process of coalescing a powdered or compacted material into a solid or porous mass under heat and/or pressure.

The protective-coated green compact with the oxygen diffusion barrier can be sintered at a sintering temperature of about 1000° C. to about 1500° C., for example at least about 1000, 1050, 1100, 1150, 1200, 1250, or 1300° C. and/or up to about 1500, 1450, 1400, 1350, 1300, 1250, or 1200° C., such as about 1100° C. to about 1500° C., about 1200° C. to about 1500° C., about 1300° C. to about 1500° C. or about 1400° C. to about 1500° C. In embodiments, the sintering temperature is about 1450° C.

In embodiments, the protective-coated green compact with the oxygen diffusion barrier is sintered at a sintering pressure of about $10^{-5}$ Torr to about $10^{-6}$ Torr.

In accordance with embodiments, sintering of the protective-coated green compact with the oxygen diffusion barrier, for example under heat and/or pressure, provides a coated fuel pellet useful in nuclear reactors, such as light-water reactors. The coated fuel pellets can include the protective coating and the oxide-based coating, applied according to the methods described herein, in an amount of about 2 wt % to about 10 wt %, or about 5 wt % to about 8 wt %, for example at least about 5, 5.5, 6, or 6.5 wt % and/or up to 8, 7.5, 7, 6.5, or 6 wt %, such as about 5 wt % to about 7 wt %, about 6 wt % to about 8 wt %, or about 6 wt % to about 7 wt %, based on the total weight of the coated fuel pellet.

Advantageously, as described herein for the fuel pellets, the methods of disclosure can provide coated fuel pellets that have increased onset temperatures for steam oxidation, for example, of at least about 500° C. In embodiments, the coated fuel pellets have an onset temperature for steam oxidation that is at least about 100° C. higher than an uncoated fuel pellet, for example at least about 100, 105, 110, 115, 120, 130, 140, 150, 160, 175, 190, or 200° C. higher than an uncoated fuel pellet. As used herein, the term "uncoated fuel pellet" refers to a fuel pellet made from the same or similar fission material powder of the green compact described herein, that does not include the protective coating or the oxide-based coating of the disclosure. In embodiments, the coated fuel pellet has an onset temperature for steam oxidation that is at least 150° C. higher than an uncoated fuel pellet.

EXAMPLES

Example 1—Formation of a Coated Uranium Silicide Fuel Pellet

Uranium silicide (U$_3$Si$_2$) fission powders, having an average diameter of 4 μm, were used to prepare green compacts (FIGS. 1A, 1B). The green compacts were made within an inert atmosphere glove box to prevent any oxidation, as U$_3$Si$_2$ powders are highly pyrophoric. A cross-sectional characterization of the green pellet (FIG. 10) showed that long, interconnected open channels were present between large and small U$_3$Si$_2$ particles in the compact. The green compacts had an approximate diameter of 9 mm, and an approximate length of 1 cm.

The green compacts were gently recovered from the pressing die (within the inert glove box) and transferred to an ALD chamber. The ALD chamber was pre-heated up to 150° C. for 2 hours to allow the moisture, if any, to be removed from the green compact. As the green compact was fragile, a vacuum was pulled within the chamber at a slow rate of about 5 Torr/min until a pressure of 0.6 Torr was reached.

After 2 hours at 150° C., the temperature of the ALD chamber was raised to 230° C. To achieve uniform heating within the compact, the temperature was held at 230° C. for 2 hours before the start of any coating process.

Protective Coating Deposition

Figure 3A:
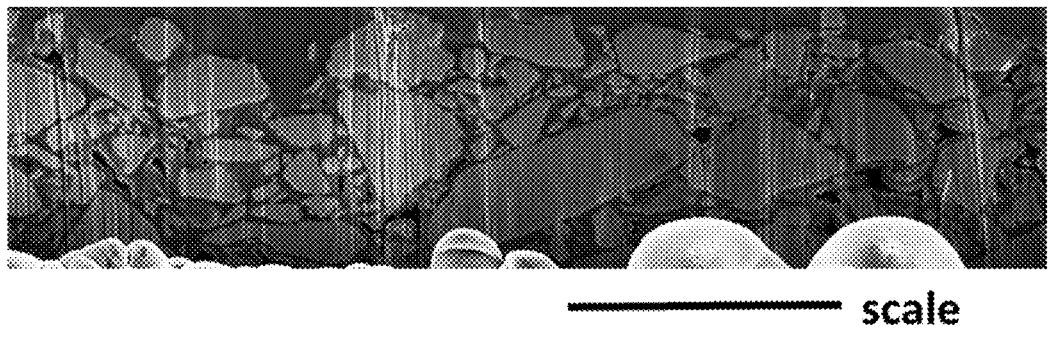
FIG. 3A is an FIB cross-section of a protective-coated green compact as described herein (scale=20 μm)
Figure 3B:
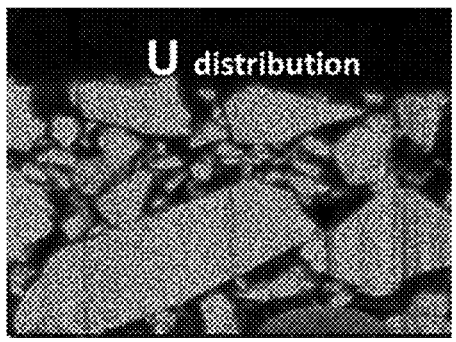
FIG. 3B is an FIB cross-section of a protective-coated green compact as described herein, showing the uranium content of the protective-coated green compact (grey areas).
Figure 3C:
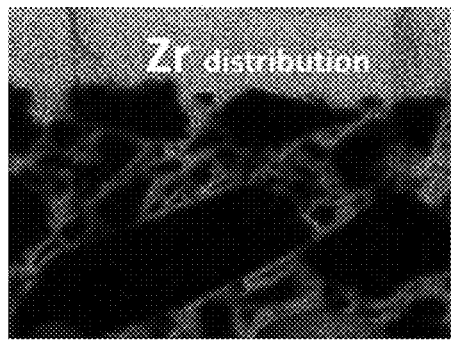
FIG. 3C is an FIB cross-section of a protective-coated green compact as described herein, showing the zirconium content of the protective-coated green compact (grey areas).
Figure 3D:
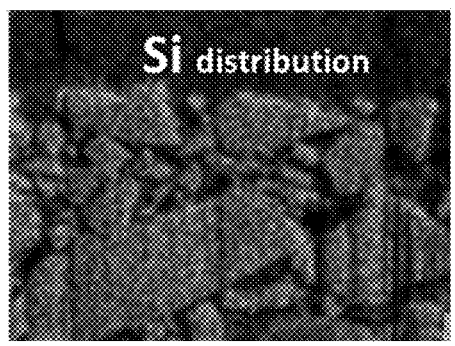
FIG. 3D is an FIB cross-section of a protective-coated green compact as described herein, showing the silicon content of the protective-coated green compact (grey areas).
Figure 3E:
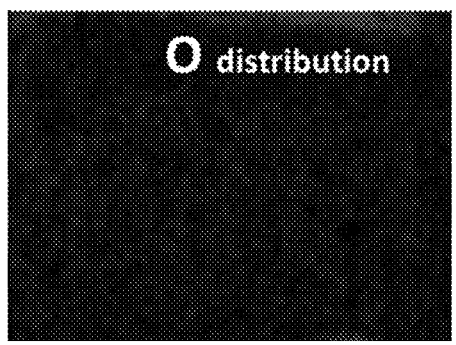
FIG. 3E is an FIB cross-section of a protective-coated green compact as described herein, showing the absence of oxygen in the protective-coated green compact (no grey areas).

Two precursors were used to provide a zirconium nitride (ZrN) protective coating on the green compact: tetrakis(dimethylamido)zirconium(IV) (TDMAZ) as the zirconium source, and ammonia as the nitrogen source. While maintaining a temperature of 230° C., the ZrN protective coating was deposited to the green compact using a pulse time of 5 seconds for TDMAZ, a pulse time of 2 seconds for ammonia, and a purge time between each precursor of 75 seconds. Under these conditions, a 50 nm ZrN coating was infiltrated into the green compact. Energy-dispersive X-ray spectroscopy (EDS) was performed on cross-sections of the protective-coated green compact and confirmed that every powder of the green compact was coated with the ZrN protective coating using a focused ion beam (FIB) technique (FIGS. 3A-3E). FIG. 3E shows that after the protective-coated green pellet was exposed to air for 2 days, no oxygen was observed.

Oxide-Based Coating Deposition

The ZrN-coated green compact was then coated with a zirconium (IV) silicate (ZrSiO$_4$) coating as the oxide-based coating/oxidation diffusion barrier. Three precursors were used: TDMAZ as the zirconium source, tris(dimethylamino)silane (TDMAS) as the silicon source, and water as the oxygen source. While maintaining a temperature of 230° C., the ZrSiO$_4$ coating was deposited to the ZrN-coated green compact using a pulse time of 8 seconds for TDMAZ, a pulse time of 8 seconds for TDMAS, a pulse time of 3 for water, and a purge time between each precursor of 60-85 seconds.

Following the deposition of the $ZrSiO_4$ coating, the total amount of coating (ZrN and $ZrSiO_4$) was approximately 500-1000 nm thick, which was enough to fully fill the pores and channels of the green compact.

Sintering

The ZrN— and $ZrSiO_4$ coated green compacts were then transferred to a pre-baked high vacuum furnace chamber. The vacuum furnace chamber was pre-baked at a temperature of 300° C. to clean its interior from any volatile organic material that may have been present. At this stage, the green compacts had sufficient mechanical strength to be handled using tweezers. Moreover, because the green compacts were completely coated, they exhibited no pyrophorocity or susceptibility to oxidation.

The compacts were loaded over tantalum foil and inserted into the furnace chamber. After reaching a vacuum level of $10^{-5}$ to $10^{-6}$ Torr, the furnace was heated to a sintering temperature of 1450° C. using a heat ramp as follows: (1) room temperature to 500° C. over 2 hours; (2) 500° C. to 800° C. over the next 4 hours; and (3) 800° C. to 1450° C. over the next 5 hours. In total, 11 hours passed in order to reach the sintering temperature. The green compacts were held at the sintering temperature of 1450° C. for 1 hour to sinter the compacts into fuel pellets, and then the furnace was cooled down to room temperature at a controlled rate of 200° C. per hour.

Figures 2A, 2B:
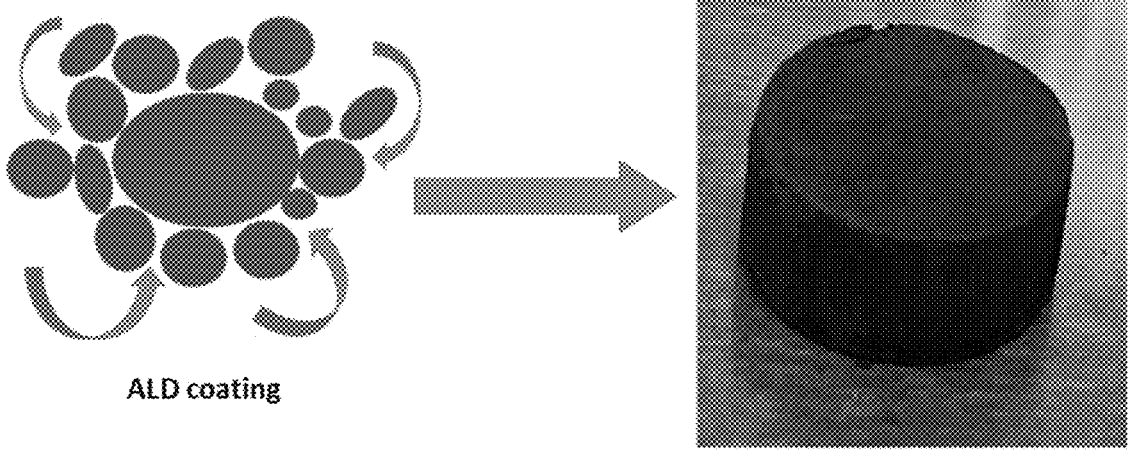
FIG. 2A is a schematic of the atomic layer deposition (ALD) infiltration into the pores and channels of a green compact to form a fuel pellet (FIG. 2B).
FIG. 2B is an image of a fuel pellet prepared according to the methods of the disclosure.

A relatively dense (~95% dense) coated fuel pellet was produced, including a coating (ZrN and $ZrSiO_4$) in an amount of about 5 wt % to about 8 wt %, based on the total weight of the fuel pellet. The resulting pellets were stable in air. No pyrophoric or oxidation observations were made after keeping the pellets exposed to ambient conditions for at least two days (FIG. 2B).

Example 2—Evaluation of a UCN Fuel Pellet

Uncoated UCN fuel pellets prepared from a mixture of uranium carbide (UC) and uranium nitride (UN) fission material powders was prepared. An elemental analysis (using SEM-EDX at 5 keV) of the surface characteristics of the UCN fuel pellets before and after exposure to about 10-100 Torr of water pressure at 280° C. (e.g., steam) for 1800 seconds was performed. The results are shown in Table 1, below.

TABLE 1

Surface Characteristics of Uncoated UCN Fuel Pellets

| Element | Before Exposure to Water Mass % | After Exposure to Water Mass % | Change in Mass % |
|---|---|---|---|
| C | 1.65 | 1.54 | −6.7% |
| N | 1.59 | 0.84 | −47.2% |
| O | 1.17 | 3.62 | +209.4% |
| U | 95.59 | 94.00 | −1.7% |
| Total | 100 | 100 | |

Figure 4:
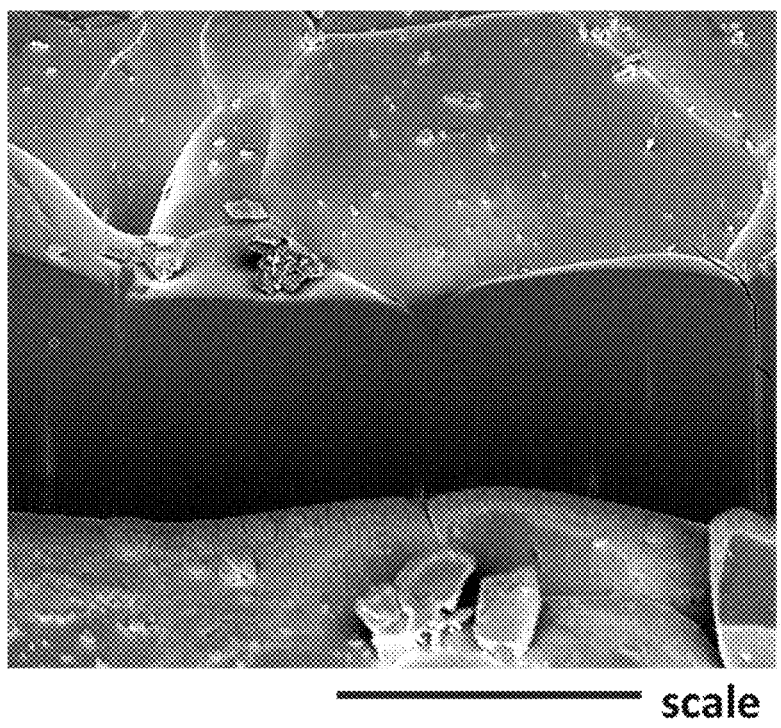
FIG. 4 is an FIB cross-section of an uncoated UCN fuel pellet prior to exposure to water (scale=10 μm).
Figure 5:
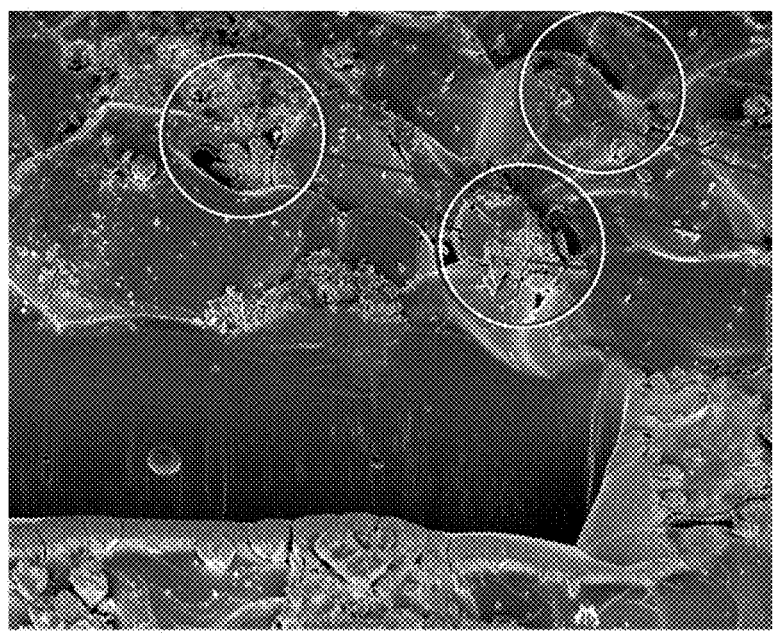
FIG. 5 is an FIB cross-section of an uncoated UCN fuel pellet after to exposure to water (scale=20 μm).

Energy-dispersive X-ray spectroscopy (EDS) using a focused ion beam (FIB) technique was also performed on cross-sections of the uncoated UCN fuel pellet before and after exposure to water. Prior to exposure, some surface oxidation was observed, but there were no major oxidation regions on the pellet (FIG. 4). Following exposure, significant oxidation regions were observed, resulting in surface cracking of the pellet (FIG. 5, areas of cracking identified in circles). Thus, based on these data, it was observed that the UCN fission material underwent significant amounts of oxidation when exposed to steam.

In order to observe the effects of oxidation on a protective-coated fuel pellet, coated UCN fuel pellets were prepared from a mixture of UC and UN fission material powders and coated with a 100 nm ZrN protective coating using ALD, as described in Example 1. An elemental analysis (using SEM-EDX at 5 keV) of the surface characteristics of the ZrN-coated UCN fuel pellets before and after exposure to about 10-100 Torr of water pressure at 280° C. (e.g., steam) for 1800 seconds was performed. The results are shown in Table 2, below.

TABLE 2

Surface Characteristics of ZrN-Coated UCN Fuel Pellets

| Element | Before Exposure to Water Mass % | After Exposure to Water Mass % | Change in Mass % |
|---|---|---|---|
| C | 2.36 | 2.84 | +20.3% |
| N | 12.86 | 8.61 | −33.0% |
| O | 1.62 | 9.26 | +471.6% |
| Zr | 83.15 | 79.29 | −4.6% |
| Total | 100 | 100 | |

Figure 6:
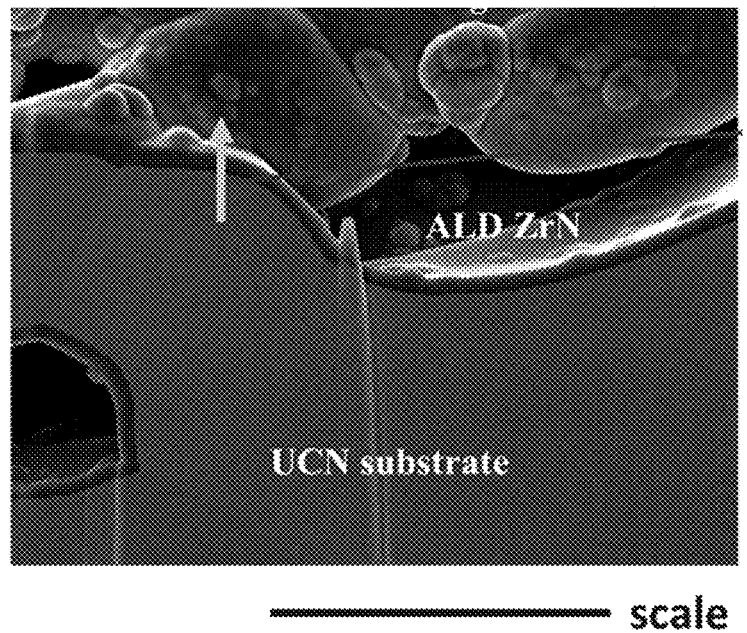
FIG. 6 is an FIB cross-section of the interface between the UCN and the ZrN of a protective-coated UCN fuel pellet after exposure to water (scale=5 μm).
Figure 7:
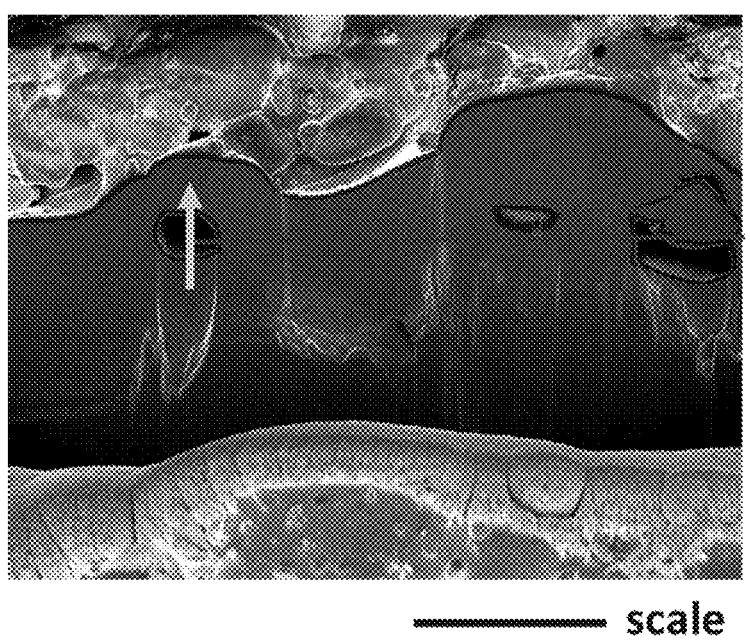
FIG. 7 is an FIB cross-section of a pore of a protective-coated UCN fuel pellet after exposure to water (scale=10 μm).

Energy-dispersive X-ray spectroscopy (EDS) using a focused ion beam (FIB) technique was also performed on cross-sections of the ZrN-coated UCN fuel pellet after exposure to water. Although oxidation of the ZrN coating was observed (as shown by the data in Table 2), the FIB cross-section of the ZrN coated pellets showed that there was no oxidation observed at the UCN/ZrN interface (FIG. 6). Moreover, the FIB cross-sections showed that the ZrN coating infiltrated through the pores and channels of the pellet and developed a uniform coating (FIG. 7). Thus, based on these data, it was observed that, despite being oxidized itself, the ZrN protective coating prevented the steam oxidation of the underlying UCN fission material.

It is to be understood that while the disclosure is read in conjunction with the detailed description thereof, the foregoing description and examples are intended to illustrate and not limit the scope of the disclosure, which is defined by the scope of the appended claims. Other aspects, advantages, and modifications are within the scope of the following claims.

What is claimed is:

1. A method of preparing a coated fuel pellet via atomic layer deposition (ALD), the method comprising:
   providing a green compact consisting of a fission material powder selected from uranium silicide, uranium nitride, uranium carbide, and combinations thereof, and gas trapped in pores and/or channels of the green compact, in an atomic layer deposition chamber and pulling a vacuum within the chamber at a rate of about 1 Torr/min to about 10 Torr/min until the atomic layer deposition chamber has a pressure of about 0.1 Torr to about 1.0 Torr thereby releasing the gas trapped in pores and/or channels of the green compact;
   depositing a protective coating on the green compact using atomic layer deposition such that the protective coating infiltrates into and coat the pores and/or channels of the green compact, to provide a protective-coated green compact, wherein the protective coating comprises a metal nitride, molybdenum, or a combination thereof;

depositing an oxide-based coating on the protective-coated green compact using atomic layer deposition such that the oxide-based coating infiltrates into and coat the protective coating coated pores and/or channels of the protective-coated green compact, thereby providing an oxidation diffusion barrier; and, sintering the protective-coated green compact with the oxygen diffusion barrier, thereby providing the coated fuel pellet.

2. The method of claim 1, wherein the metal nitride is selected from the group consisting of aluminum nitride (AlN), silicon nitride ($Si_3N_4$), titanium nitride (TiN), zirconium nitride (ZrN), or any combination thereof.

3. The method of claim 1, wherein the protective coating comprises molybdenum.

4. The method of claim 1, wherein the oxide-based coating is selected from the group consisting of aluminum oxide ($Al_2O_3$), zirconium oxide ($ZrO_2$), zirconium (IV) silicate ($ZrSiO_4$), silicon dioxide ($SiO_2$), yttrium oxide ($Y_2O_3$), chromium (II) oxide (CrO), chromium (III) oxide ($Cr_2O_3$), chromium (IV) oxide ($CrO_2$), chromium (VI) oxide ($CrO_3$), and any combination thereof.

5. The method of claim 1, wherein the protective coating and/or the oxide-based coating is deposited at a temperature of about 200° C. to about 250° C.

6. The method of claim 1, wherein depositing the protective coating comprises alternately depositing two or more protective coating precursors on the green compact, wherein the two or more protective coating precursors are independently selected from the group consisting of tetrakis (dimethylamido) zirconium (IV) (TDMAZ), trimethylaluminum, tris (dimethylamido) aluminum (III), tetrakis (diethylamido) titanium (IV) (TDEAT), tris (dimethylamino) silane (TDMSi), disilane, molybdenum hexafluoride, ammonia, hydrazine, and any combination thereof.

7. The method of claim 6, wherein depositing each of the protective coating precursors has a pulse time of about 1 second to about 10 seconds and a purge time of at least about 60 seconds.

8. The method of claim 1, wherein depositing the oxide-based coating comprises alternately depositing two or more oxide-based coating precursors on the protective-coated green compact, wherein the two or more oxide-based coating precursors are independently selected from the group consisting of tetrakis (dimethylamido) zirconium (IV) (TDMAZ), bis (methyl-$\eta_5$-cyclopentadienyl)methoxymethylzirconium (ZRCMMM), trimethylaluminum, tris (dimethylamido) aluminum (III), tetrakis (dimethylamido) titanium (IV) (TDMAT), tetrakis (diethylamido) titanium (IV) (TDEAT), titanium tetrachloride, tris (dimethylamino) silane (TDMAS), hexachlorodisilane, water, hydrogen peroxide, ozone, tris (cyclopentadienyl) yttrium ($Cp_3Y$), tris (methylcyclopentadienyl) yttrium (($CpCH_3)_3Y$), bis (cyclopentadienyl) chromium (II), bis (pentamethylcyclopentadienyl) chromium (II), chromyl chloride, methanol, and any combination thereof.

9. The method of claim 8, wherein depositing each of the oxide-based coating precursors has a pulse time of about 1 second to about 10 seconds and a purge time of at least about 60 seconds.

10. The method of claim 1, wherein the coated fuel pellet comprises the protective coating and the oxide-based coating in an amount of about 2 wt % to about 10 wt %, based on the total weight of the coated fuel pellet.

11. The method of claim 1, wherein the coated fuel pellet has an onset temperature for steam oxidation that is at least about 100° C. higher than an uncoated fuel pellet.

12. The method of claim 1, wherein the fission material powder has a particle size of about 2 microns to about 8 microns.

* * * * *